US008773938B2

(12) United States Patent
Sasaki

(10) Patent No.: US 8,773,938 B2
(45) Date of Patent: Jul. 8, 2014

(54) SEMICONDUCTOR DEVICE

(75) Inventor: Toshiro Sasaki, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 300 days.

(21) Appl. No.: 13/064,915

(22) Filed: Apr. 26, 2011

(65) Prior Publication Data

US 2011/0267902 A1 Nov. 3, 2011

(30) Foreign Application Priority Data

Apr. 28, 2010 (JP) ................................. 2010-104505

(51) Int. Cl.
*G11C 5/14* (2006.01)

(52) U.S. Cl.
USPC .......................................... 365/226; 345/211

(58) Field of Classification Search
USPC ............ 365/226, 189.11; 327/99; 326/88, 92; 345/530, 211, 98
See application file for complete search history.

(56) References Cited

U.S. PATENT DOCUMENTS

| 5,444,664 | A  | * | 8/1995  | Kuroda et al. | ................. | 365/226 |
| 7,639,547 | B2 | * | 12/2009 | Moon et al.   | ..............    | 365/189.09 |
| 8,552,794 | B2 | * | 10/2013 | Hirobe et al. | .................  | 327/541 |

| 2001/0001545 | A1 | * | 5/2001  | Kono et al.  | .................... | 327/541 |
| 2004/0004876 | A1 | * | 1/2004  | Choi et al.  | ..................... | 365/202 |
| 2006/0061346 | A1 | * | 3/2006  | Lee et al.   | ....................... | 323/313 |
| 2006/0291279 | A1 | * | 12/2006 | Shin et al.  | ..................... | 365/183 |
| 2007/0001981 | A1 | * | 1/2007  | Tahata       | ............................. | 345/98 |
| 2007/0086249 | A1 | * | 4/2007  | Lee et al.   | ................. | 365/189.09 |
| 2007/0262757 | A1 | * | 11/2007 | Kawagoshi    | .................. | 323/265 |
| 2009/0051419 | A1 | * | 2/2009  | Jeong        | ............................ | 327/543 |

FOREIGN PATENT DOCUMENTS

| JP | 2000-067591 A | 3/2000 |
| JP | 2007-010894 A | 1/2007 |

OTHER PUBLICATIONS

Japanese Office Action issued on Apr. 1, 2014 with English translation.

* cited by examiner

*Primary Examiner* — Douglas King
(74) *Attorney, Agent, or Firm* — Rabin & Berdo, P.C.

(57) ABSTRACT

A semiconductor device includes a drive circuit that outputs a drive signal to drive an external device; a voltage output circuit that outputs a first voltage and a second voltage that is larger than the first voltage; a selector that, when supplying a power supply voltage to the drive circuit, selects the first voltage and, when supplying a power supply voltage to an internal device, selects the second voltage; and a step-up circuit that, when the first voltage selected by the selector is input, boosts the first voltage to a third voltage and outputs the third voltage as the power supply voltage to the drive circuit and, when the second voltage selected by the selector is inputted, boosts the second voltage to a fourth voltage and outputs the fourth voltage as the power supply voltage to the internal device.

8 Claims, 6 Drawing Sheets

SEMICONDUCTOR DEVICE

CROSS-REFERENCE TO RELATED APPLICATION

This application claims priority under 35 USC 119 from Japanese Patent Application No. 2010-104505 filed on Apr. 28, 2010, the disclosure of which is incorporated by reference herein.

BACKGROUND OF THE INVENTION

1. Field of the Invention

The present invention relates to a semiconductor device and particularly to a semiconductor device on which a drive circuit that drives an external device is formed.

2. Related Art

Generally, semiconductor devices on which a drive circuit that drives an external device is formed (mounted) are known. For example, there are microcomputers on which an LCD panel driver that is a drive circuit for driving a liquid crystal display (LCD) is formed. FIG. 6 shows the general configuration of one example of a conventional microcomputer on which an LCD driver panel is formed.

The semiconductor device 100 shown in FIG. 6 is equipped with an LCD panel driver 112, a VPP generating circuit 121, a flash memory 122, a reference voltage circuit 124, a VLCD step-up circuit 128, and a logic circuit 130.

The reference voltage circuit 124 generates a reference voltage VREF by an inputted power supply voltage VDD. The VLCD step-up circuit 128 boosts the inputted reference voltage VREF to a drive voltage VLCD and outputs the drive voltage VLCD to the LCD panel driver 112. The flash memory 122 stores various programs and so forth.

The flash memory 122 executes three types of operations—an erase operation, a program operation, and a read operation—as operation modes controlled by an operation instruction from the logic circuit 130. In contrast to when the flash memory 22 performs the read operation, the flash memory 22 cannot perform the erase operation and the program operation unless a high voltage is supplied thereto. For that reason, the step-up circuit generates a voltage according to the operation of the memory and supplies the voltage to the memory in accordance with the operation. For example, Japanese Patent Application Laid-Open (JP-A) No. 2000-67591 describes a voltage generating circuit that is a step-up circuit for a memory that generates a voltage according to each operation of the memory.

In the case of the conventional semiconductor device 100 shown in FIG. 6, when the flash memory 122 performs the read operation, it can execute that operation by only the supply of the power supply voltage VDD, but when the flash memory 122 performs the erase operation or the program operation, it cannot execute those operations unless a voltage VPP that is a high voltage is supplied apart from the supply of the power supply voltage VDD. For that reason, when the flash memory 122 performs the erase operation or the program operation, the VPP generating circuit 121 boosts the power supply voltage VDD to the voltage VPP and supplies the voltage VPP to the flash memory 122.

In this way, because the VPP generating circuit 121 is needed as a step-up circuit for supplying a voltage according to the operation of the flash memory 122, an increase in the chip size resulting from the circuit scale occurs. Because of this, there have been cases where problems such as a cost increase, for example, arise.

SUMMARY

The present invention has been proposed in consideration of the above and provides a semiconductor device that can control an increase in the area of a chip on which a drive circuit that drives an external device is formed.

One aspect of the present invention is a semiconductor device comprising: a drive circuit that outputs a drive signal to drive an external device; a voltage output circuit that outputs a first voltage and a second voltage that is larger than the first voltage; a selector that, when supplying a power supply voltage to the drive circuit, selects the first voltage and, when supplying a power supply voltage to an internal device, selects the second voltage; and a step-up circuit that, when the first voltage selected by the selector is input, boosts the first voltage to a third voltage and outputs the third voltage as the power supply voltage to the drive circuit and, when the second voltage selected by the selector is inputted, boosts the second voltage to a fourth voltage and outputs the fourth voltage as the power supply voltage to the internal device.

In the above-described aspect, the internal device may includes a memory, and, when performing data writing or erasure in the memory, the step-up circuit may boost the second voltage selected by the selector to the fourth voltage and the memory perform may data writing or erasure via the fourth voltage outputted by the step-up circuit.

In the above-described aspect, the voltage output circuit may generate and output the first voltage and the second voltage by a fifth voltage supplied from outside. Further, the internal device may include a memory to which the fifth voltage is supplied, and, when performing data reading from the memory, the memory may perform data reading via the fifth voltage.

In the above-described aspect, the semiconductor device may further comprise a first wire that interconnects the drive circuit and the step-up circuit, a second wire that interconnects the internal device and the step-up circuit, and a substrate on which the drive circuit, the voltage output circuit, the selector, the step-up circuit, the internal device, the first wire, and the second wire are formed. Further, the second wire may be formed on the substrate on an inner side of the first wire.

Here, the semiconductor device may further comprise plural connection terminals that interconnect the drive circuit and the external device. Further, at least some of the connection terminals may be formed in a formation region along an outer periphery of the substrate, and the first wire may be formed along the formation region.

Furthermore, here, at least part of the second wire may be formed along the first wire.

In the above-described aspect, the semiconductor device may further comprise an external connection terminal that is formed adjacent to the step-up circuit and interconnects the step-up circuit and at least one of a step-up capacitor or a stabilizing capacitor disposed outside.

In the above-described aspect, the semiconductor device may further comprise a control circuit that controls the selector to select the second voltage when supplying a voltage to the internal device in accordance with an operation of the internal device. Further, at least one of the voltage output circuit or the selector may be formed between the control circuit and the step-up circuit.

According to the above aspect, an increase in the area of a chip on which a drive circuit that drives an external device is formed can be controlled.

BRIEF DESCRIPTION OF THE DRAWINGS

An exemplary embodiment of the present invention will be described in detail based on the following figures, wherein.

DETAILED DESCRIPTION

Figure 1:
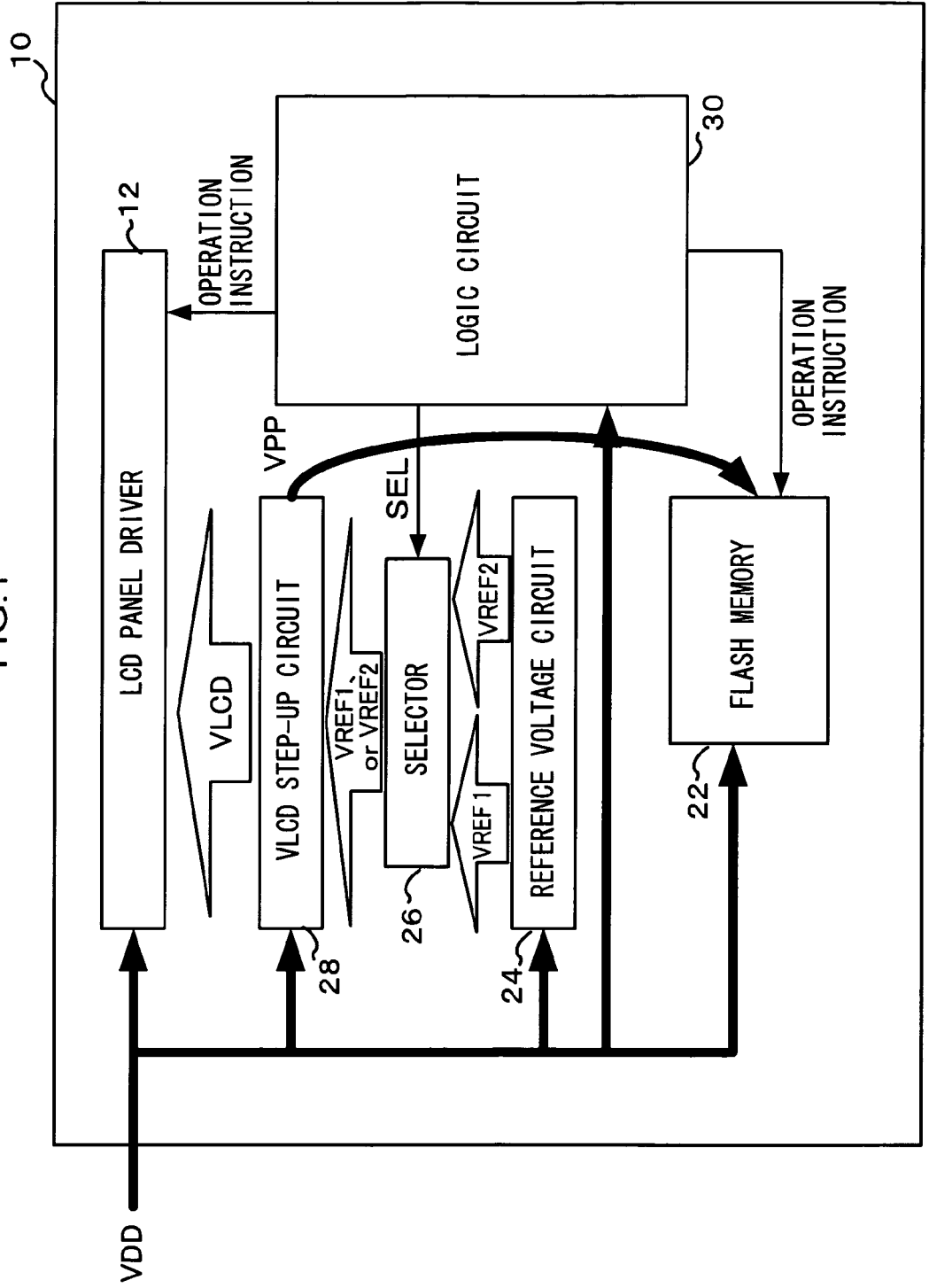
FIG. 1 is a general configuration diagram showing one example of the general configuration of a semiconductor device pertaining to the exemplary embodiment.

First, the configuration of a semiconductor device 10 of the present exemplary embodiment will be described. FIG. 1 is a diagram showing one example of the general configuration of the semiconductor device 10 of the present exemplary embodiment. The semiconductor device 10 of the present exemplary embodiment is, as one specific example, a semiconductor device (LSI) that is a microcomputer on which an LCD panel driver 12 that is a drive circuit for driving an LCD panel (not shown) that is an external device and a flash memory 22 that is an internal device are formed. The LCD panel driver 12 drives the LCD panel such that display based on data read from the flash memory 22 is performed by the control of a logic circuit 30.

The semiconductor device 10 of the present exemplary embodiment is equipped with the LCD panel driver 12, the flash memory 22, a reference voltage circuit 24, a selector 26, a VLCD step-up circuit 28, and the logic circuit 30. The LCD panel driver 12, the flash memory 22, the reference voltage circuit 24, the VLCD step-up circuit 28, and the logic circuit 30 are each driven by a power supply voltage VDD supplied from outside the semiconductor device 10.

In the present exemplary embodiment, the flash memory 22 is a storage device that stores various programs, data, and so forth. The flash memory 22 executes three types of operations: an erase operation where the flash memory 22 initializes (erases) written data, a program operation where the flash memory 22 writes data, and a read operation where the flash memory 22 reads data that have been written. The read operation is executable by the supply of the power supply voltage, which is low compared to a voltage required for the erase operation and the program operation. In the present exemplary embodiment, the read operation is executed by only the supply of the power supply voltage VDD, and the erase operation and the program operation are executed by the supply of a voltage VPP that is a high voltage apart from the power supply voltage VDD. In the present exemplary embodiment, the magnitudes of the voltage values have the relationship of: power supply voltage VDD<drive voltage VLCD<voltage VPP. In the semiconductor device 10 of the present exemplary embodiment, specific examples of the voltages include 2.85 V to 3.6 V for the power supply voltage VDD (lowest VDD voltage=2.85 V or higher), 4.0 V to 6.0 V for the drive voltage VLCD, and 8 V for the voltage VPP.

The logic circuit 30 outputs to the LCD panel driver 12 an operation instruction (signal) for driving the LCD panel, outputs to the flash memory 22 an operation instruction instructing the flash memory 22 to perform any of the aforementioned operations (or instructing the flash memory 22 not to perform any of the operations), and outputs to the selector 26 a selection signal SEL for causing the selector 26 to select either a reference voltage VREF1 or a reference voltage VREF2 depending on the operations of the LCD panel driver 12 and the flash memory 22.

The reference voltage circuit 24 generates the reference voltage VREF1 for generating the drive voltage VLCD and the reference voltage VREF2 for generating the voltage VPP. The selector 26 selects either the reference voltage VREF1 or the reference voltage VREF2 in accordance with the selection signal SEL inputted from the logic circuit 30. The selector 26 is, for example, a switch circuit. In the present exemplary embodiment, the selector 26 selects the reference voltage VREF1 in a state where the LCD panel driver 12 during normal times is driving the LCD panel and in a state where the flash memory 22 executes the read operation, and the selector 26 selects the reference voltage VREF2 in a state where the flash memory 22 executes the erase operation or the program operation.

When the reference voltage VREF1 is inputted to the VLCD step-up circuit 28, the VLCD step-up circuit 28 boosts the reference voltage VREF1 to the drive voltage VLCD and outputs the drive voltage VLCD to the LCD panel driver 12, and when the reference voltage VREF2 is inputted to the VLCD step-up circuit 28, the VLCD step-up circuit 28 boosts the reference voltage VREF2 to the voltage VPP and outputs the voltage VPP to the flash memory 22. The VLCD step-up circuit 28 of the present exemplary embodiment boosts both the reference voltage VREF1 and the reference voltage VREF2 by the same multiplying power. For example, when the multiplying power is set to 4 in the step-up circuit 28, the step-up circuit 28 outputs a drive voltage VLCD equal to 6 V when the reference voltage VREF1 is 1.5 V and outputs a voltage VPP equal to 8 V when the reference voltage VREF2 is 2.0 V.

The LCD panel driver 12 is a drive circuit for driving the LCD panel disposed outside the semiconductor device 10 by the instruction from the logic circuit 30.

Next, operations according to each operation of the flash memory 22 of the semiconductor device 10 of the present exemplary embodiment will be described.

Figure 2:
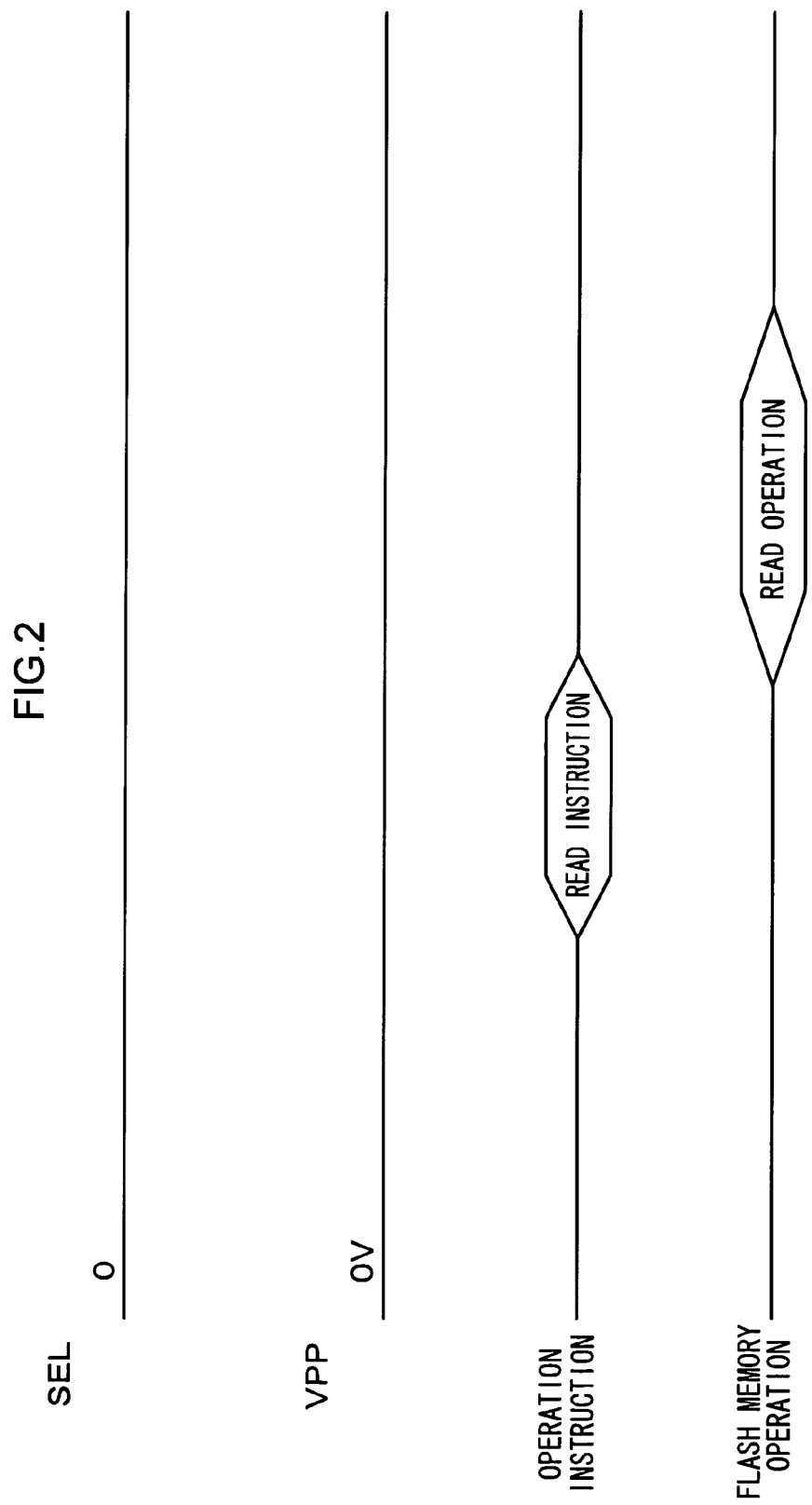
FIG. 2 is a time chart for describing one example when a flash memory formed on the semiconductor device pertaining to the exemplary embodiment performs a read operation.

FIG. 2 is a time chart when the flash memory 22 executes the read operation. The logic circuit 30 outputs to the selector 26 a low level (0) selection signal SEL. The selector 26 selects the reference voltage VREF1 that is the output from the reference voltage circuit 24 on the basis of the low level selection signal SEL and outputs the reference voltage VREF1 to the VLCD step-up circuit 28. The VLCD step-up circuit 28 boosts the reference voltage VREF1 to the drive voltage VLCD and outputs the drive voltage VLCD to the LCD panel driver 12. In this case, because the VLCD step-up circuit 28 does not generate the voltage VPP, the voltage VPP is equal to 0 V.

The logic circuit 30 outputs a read instruction (an operation instruction for causing the flash memory 22 to perform the read operation) to the flash memory 22. The flash memory 22 executes the read operation in accordance with the read instruction by only the supply of the power supply voltage VDD.

Figure 3:
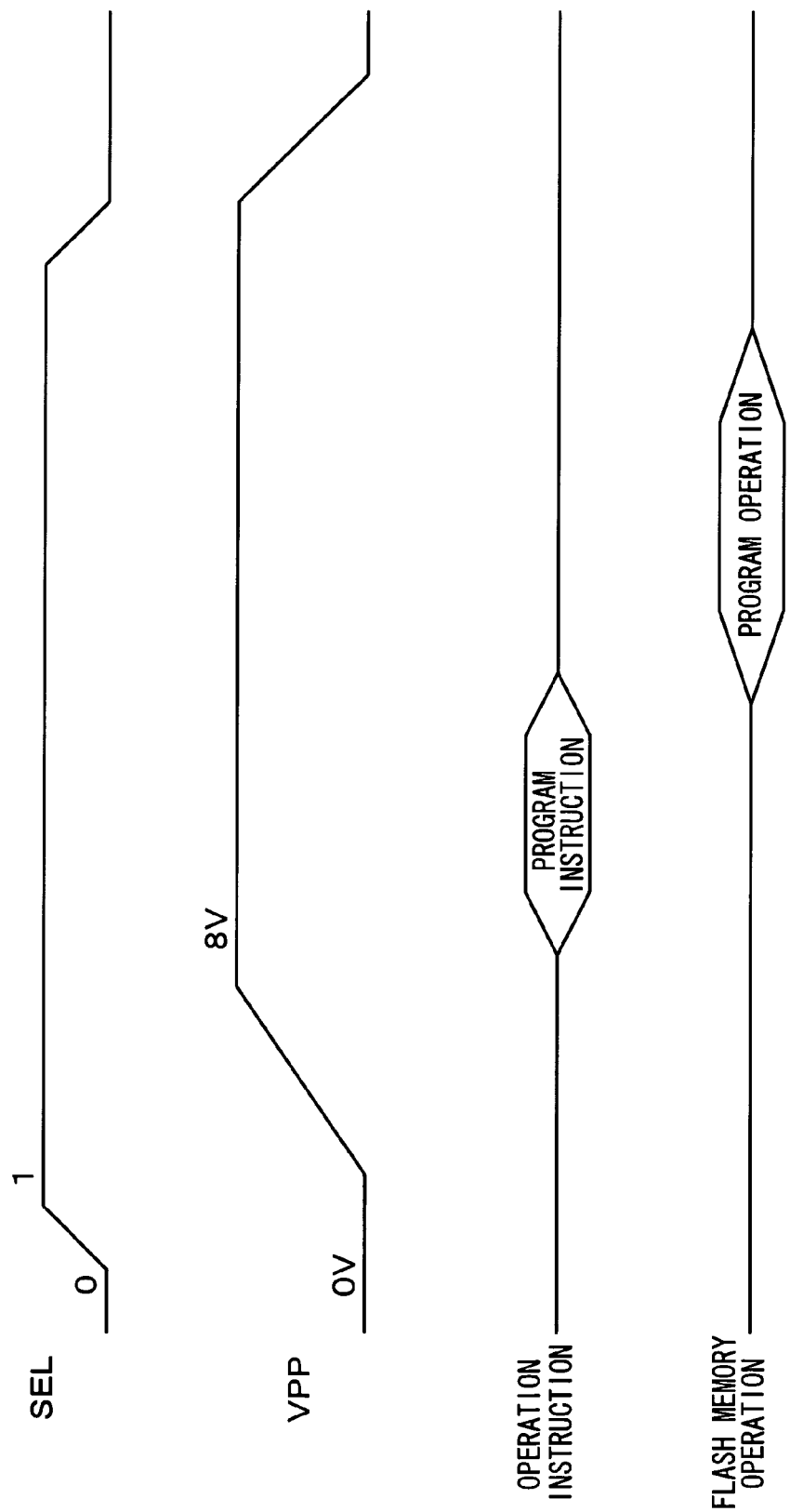
FIG. 3 is a time chart for describing one example when the flash memory formed on the semiconductor device pertaining to the exemplary embodiment performs a program operation.

FIG. 3 is a time chart when the flash memory 22 executes the program operation.

The logic circuit 30 outputs to the selector 26 a high level (1) selection signal SEL. The selector 26 selects the reference voltage VREF2 that is the output from the reference voltage circuit 24 in accordance with the change in the level of the signal (the change to the high level; more strictly, a plus instruction). The VLCD step-up circuit 28 boosts the reference voltage VREF2 to the voltage VPP and outputs the voltage VPP to the flash memory 22. In this case, because the drive voltage VLCD is a high voltage, the LCD panel driver 12 is in a stopped state (a state where it is not driving the LCD panel).

After a predetermined amount of time (in the present exemplary embodiment, an amount of time until the voltage VPP becomes 8 V) from when the VLCD step-up circuit 28 starts boosting the voltage in accordance with the change in the selection signal SEL to until the voltage boosting is completed elapses after the logic circuit 30 outputs the high level selection signal SEL to the selector 26, the logic circuit 30 outputs a program instruction (an operation instruction for causing the flash memory 22 to perform the program operation) to the flash memory 22. The flash memory 22 to which the voltage VPP is being supplied executes the program operation in accordance with the program instruction.

Figure 4:
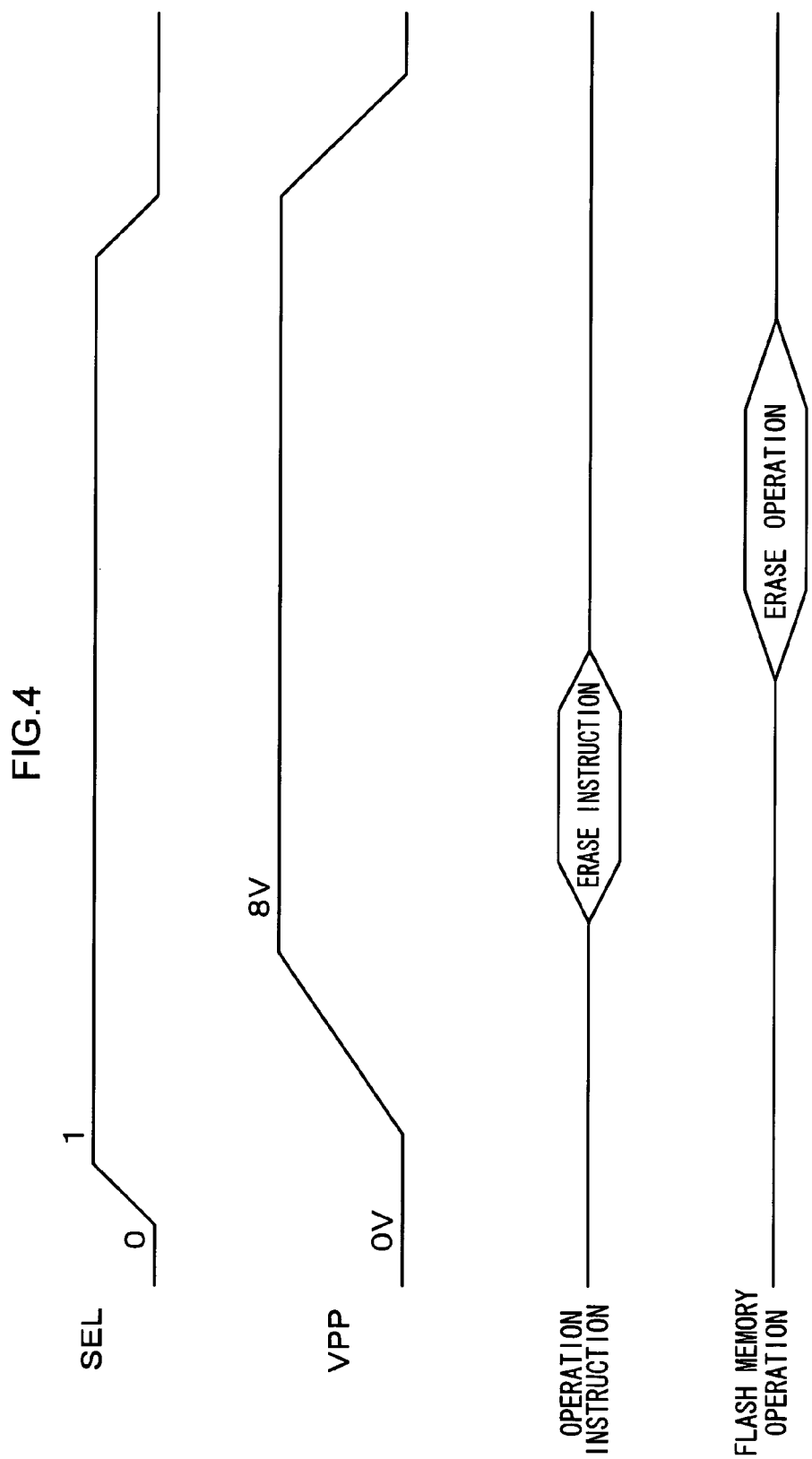
FIG. 4 is a time chart for describing one example when the flash memory formed on the semiconductor device pertaining to the exemplary embodiment performs an erase operation.

FIG. 4 is a time chart when the flash memory 22 executes the erase operation. As shown in FIG. 4, the time chart when the flash memory 22 executes the erase operation is substantially the same as the time chart when the flash memory 22 executes the program operation shown in FIG. 3, and therefore, detailed description of the time chart when the semiconductor device 10 executes the erase operation will be omitted.

As described above, in the semiconductor device 10 of the present exemplary embodiment, the reference voltage circuit 24 generates the reference voltage VREF1 and the reference voltage VREF2. When the flash memory 22 is to execute the read operation, the logic circuit 30 outputs to the selector 26 the selection signal SEL for causing the selector 26 to select the reference voltage VREF1, and the selector 26 selects the reference voltage VREF1 in accordance with the inputted SEL signal and outputs the reference voltage VREF1 to the VLCD step-up circuit 28. The VLCD step-up circuit 28 boosts the inputted reference voltage VREF1, generates the drive voltage VLCD, and outputs the drive voltage VLCD to the LCD panel driver 12. Further, the flash memory 22 executes the read operation using only the supply of the power supply voltage VDD in accordance with the operation instruction from the logic circuit 30. However, when the flash memory 22 is to execute the program operation or the erase operation, the logic circuit 30 outputs to the selector 26 the selection signal SEL for causing the selector 26 to select the reference voltage VREF2, and the selector 26 selects the reference voltage VREF2 in accordance with the inputted SEL signal and outputs the reference voltage VREF2 to the VLCD step-up circuit 28. The VLCD step-up circuit 28 boosts the inputted reference voltage VREF2, generates the voltage VPP that is a high voltage, and outputs the voltage VPP to the flash memory 22. The flash memory 22 receives the supply of the voltage VPP and executes the program operation or the erase operation in accordance with the operation instruction from the logic circuit 30.

In this way, in the semiconductor device 10 of the present exemplary embodiment, the VLCD step-up circuit 28 for boosting the reference voltage VREF1 to generate the drive voltage VLCD supplied to the LCD panel driver 12 is appropriated as a step-up circuit for generating a voltage according to the operation of the flash memory 22 (the voltage VPP, which is a higher voltage than the power supply voltage VDD, for allowing the flash memory 22 to execute the program operation and the erase operation). Therefore, there is no need to separately provide a step-up circuit for the flash memory 22.

Consequently, compared to when a step-up circuit for the flash memory 22 is separately provided, an increase in the area of the semiconductor device 10—more specifically, the area of the substrate (chip) on which the LCD panel driver 12, the flash memory 22, the reference voltage circuit 24, the selector 26, the VLCD step-up circuit 28, and the logic circuit 30 are formed—can be controlled.

Figure 5:
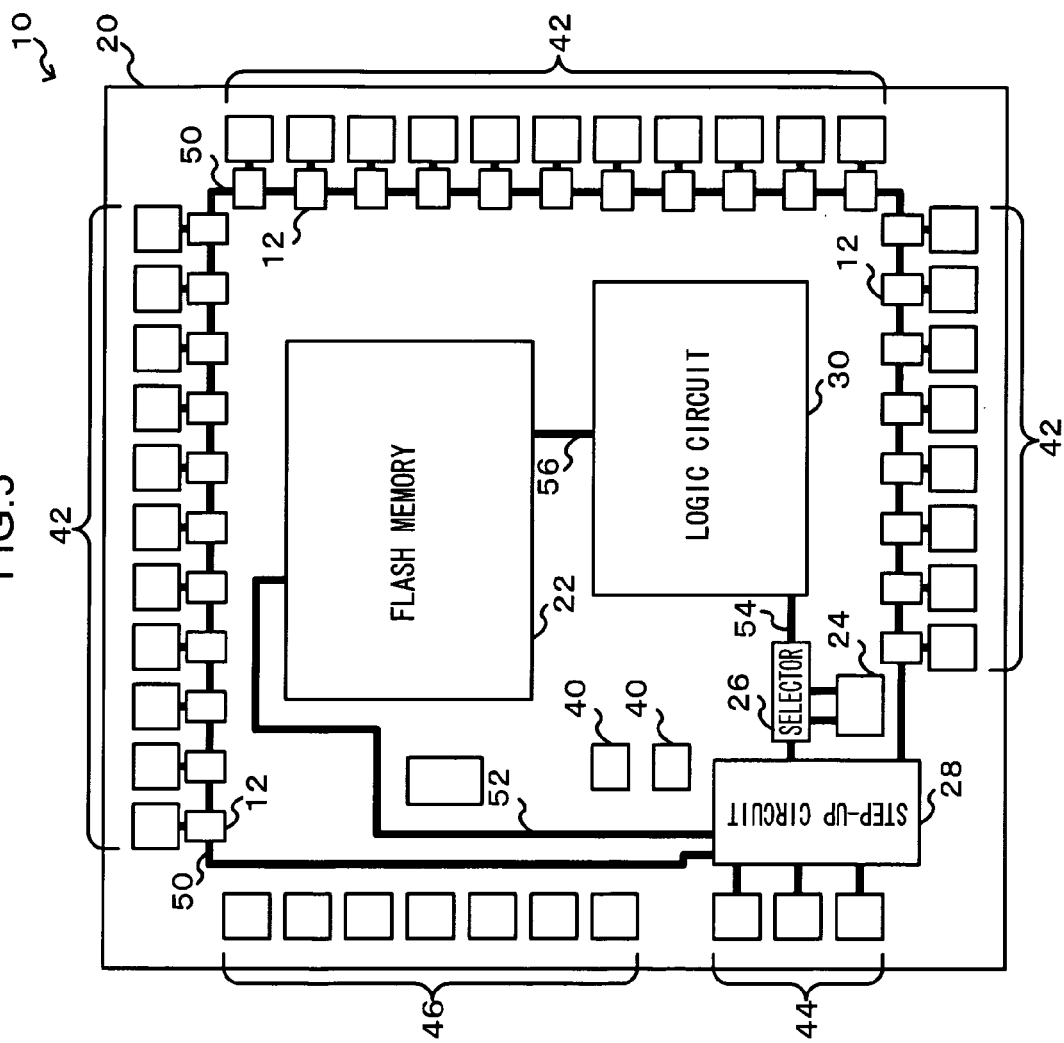
FIG. 5 is a configuration diagram showing one specific example of the configuration of the semiconductor device pertaining to the exemplary embodiment.
Figure 6:
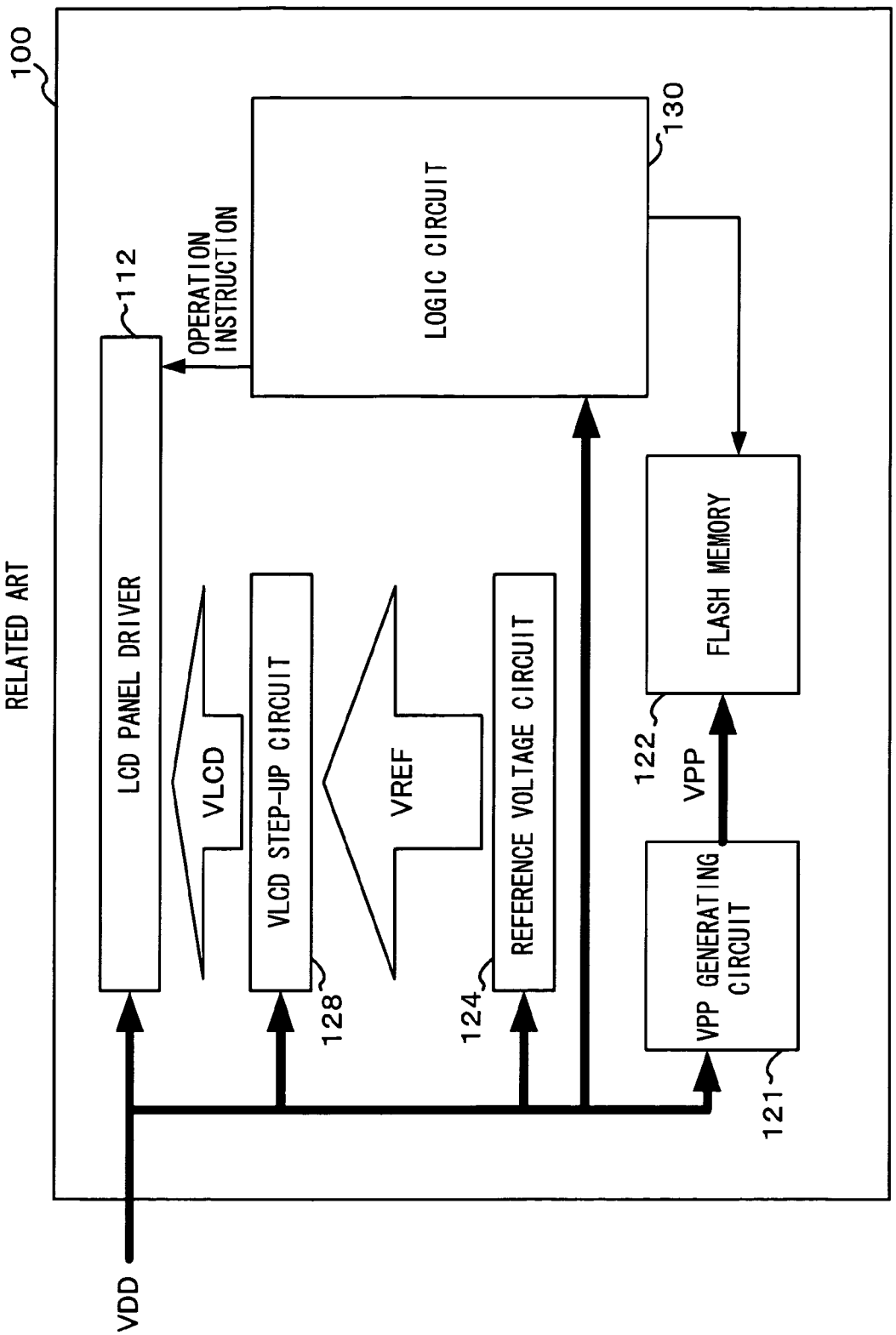
FIG. 6 is a general configuration diagram showing one example of the general configuration of a conventional semiconductor device.

Next, a specific example of the semiconductor device 10 of the present exemplary embodiment will be described in detail. FIG. 5 is a configuration diagram showing a specific example of the semiconductor device 10 of the present exemplary embodiment. The semiconductor device 10 is configured by forming plural LCD panel drivers 12, the flash memory 22, the reference voltage circuit 24, the selector 26, the VLCD step-up circuit 28, the logic circuit 30, input pads 40, output pads 42, output pads 44, and output pads 46 on a substrate 20.

The input pads 40 are input terminals to which the power supply voltage VDD is inputted from an external power supply. In FIG. 5, illustration of the wires for supplying the power supply voltage VDD is omitted in order to avoid the drawing being complicated. Further, the output pads 46 are connected to the logic circuit 30, but illustration of the wires connecting the output pads 46 to the logic circuit 30 is also omitted for the same reason.

As shown in FIG. 5, the semiconductor device 10 of the present exemplary embodiment is equipped with the plural LCD panel drivers 12. In FIG. 5, reference numerals indicating some of the LCD panel drivers 12 are omitted. Further, the LCD panel drivers 12 are connected to the logic circuit 30 such that the operation instructions are inputted to the LCD panel drivers 12 from the logic circuit 30, but illustration of the wires connecting the LCD panel drivers 12 to the logic circuit 30 is omitted.

In the present exemplary embodiment, in order for drive signals to be outputted from the LCD panel drivers 12 to an external LCD panel (not shown), the output pads 42 for connecting the LCD panel drivers 12 to the LCD panel are formed. In FIG. 5, the LCD panel drivers 12 and the output pads 42 corresponding to the LCD panel drivers 12 are formed in regions along the outer periphery of the upper side, the right side, and the lower side of the substrate 20. Further, in the present exemplary embodiment, a power supply line 50 that interconnects the LCD panel drivers 12 and the VLCD step-up circuit 28 and is used to supply the drive voltage VLCD boosted by the VLCD step-up circuit 28 is formed (wired) in a region along the outer periphery of the substrate 20 as shown in FIG. 5.

Further, a power supply line 52 (for example, a wire of about 10 μm) that interconnects the flash memory 22 and the VLCD step-up circuit 28 and is used to supply the voltage VPP boosted by the VLCD step-up circuit 28 is wired along the power supply line 50 in a region of the substrate 20 on the inner side of the power supply line 50 as shown in FIG. 5. In the present exemplary embodiment, the inter-wire distance between the power supply line 50 and the power supply line 52 is about 20 μm in the portion where the power supply line 52 is wired along the power supply line 50 (in FIG. 5, the region along the outer periphery of the left side of the substrate 20).

That is, in the semiconductor device 10 of the present exemplary embodiment, the power supply line 52 is formed in a region of the substrate 20 on the inner side of the power supply line 50, and at least part of the power supply line 52 is formed in a region along the power supply line 50. If the power supply line 50 and the power supply line 52 cross, inter-wire capacitance occurs in the portion where the lines cross and an electric potential (noise) is generated in the power supply line 50, whereby the electric potential ends up being inappropriately supplied to the LCD panel drivers 12 and the LCD driver panels 12 improperly operate (malfunction). When the LCD panel drivers 12 improperly operate, for example, the LCD panel are erroneously lighting up. However, in the present exemplary embodiment, the power supply line 50 and the power supply line 52 do not cross in this way, so the occurrence of inter-wire capacitance can be controlled and improper operations of the LCD panel drivers 12 can be prevented.

Further, the VLCD step-up circuit 28 of the present exemplary embodiment utilizes at least one of a step-up capacitor and a stabilizing capacitor (depending to the specifications of the VLCD step-up circuit 28 and so forth) disposed outside the semiconductor device 10 to boost the reference voltage VREF1 and the reference voltage VREF2, and is connected via the output pads 44 to at least one of the step-up capacitor and the stabilizing capacitor disposed outside. In the present exemplary embodiment, as shown in FIG. 5, the output pads 44 are formed in a region along the outer periphery of the lower portion of the left side of the substrate 20, and the VLCD step-up circuit 28 is formed adjacent to the output pads 44 on the substrate 20 on the inner side of the output pads 44. Because the VLCD step-up circuit 28 is a step-up circuit, its step-up efficiency (the ratio of the output voltage with respect to the input voltage; for example, when the input voltage is 1 V, the multiplying power is 4, and the output voltage is 2 V, the step-up efficiency is 50%) is important as a characteristic of a step-up circuit. The step-up efficiency is determined by the load current with respect to the output, the capacitive component and the resistive component inside the circuit, and so forth. In the present exemplary embodiment, since the VLCD step-up circuit 28 is formed in a position adjacent to the output pads 44, a drop in the step-up efficiency can be controlled because the capacitive component and the resistive component that determine the step-up efficiency decrease.

Further, the flash memory 22 and the logic circuit 30 of the present exemplary embodiment are interconnected by a signal line 56 that is used to input the operation instructions. Further, the voltage reference circuit 24 and the selector 26 are formed between the VLCD step-up circuit 28 and the logic circuit 30, and the logic circuit 30 and the selector 26 are interconnected by a signal line 54 to which the selection signal SEL is outputted. By forming at least one of the voltage reference circuit 24 and the selector 26 between the VLCD step-up circuit 28 and the logic circuit 30 in this way, the wires (the signal line 54, etc.) connecting the circuits can be shortened, which can contribute to a reduction of the wiring region. Consequently, the area of the substrate 20 can be reduced.

The configuration of the semiconductor device 10 shown in FIG. 5 is one exemplary embodiment and embodiments of the present invention are not limited to this. For example, the numbers of the LCD panel drivers 12 and the output pads 42 may be other numbers, and the output pads 42 do not have to be disposed for each of the LCD panel drivers 12. Further, the wiring positions of the power supply line 50 and the power supply line 52 are not limited to the present embodiment as long as the power supply line 50 and the power supply line 52 are wired such that they do not cross. For example, the power supply line 52 may be wired in another position, such as being led around to the right side near the center of the substrate 20 and connected to the flash memory 22 near the area between the flash memory 22 and the logic circuit 30. However, from the standpoint of reducing the area of the substrate 20 and in consideration of the occurrence of noise such as wiring capacitance and the like, it is preferable to form the power supply line 50 along the peripheral edges of the substrate 20 and to form the power supply line 52 on the inner side of the power supply line 50 such that at least part of the power supply line 52 is disposed along the power supply line 50 as in the present exemplary embodiment.

Further, in the present exemplary embodiment, the semiconductor device 10 has been described in which the LCD panel driver 12 that drives the external LCD panel, the flash memory 22 serving as the internal device, and the VLCD step-up circuit 28 that boosts the reference voltage VREF1 and the reference voltage VREF2 and supplies the reference voltage VREF1 and the reference voltage VREF2 to the LCD panel driver 12 and the flash memory 22 are formed on the same substrate 20. However, the semiconductor device is not limited to this exemplary embodiment. It suffice that the semiconductor device is equipped with a step-up circuit that boosts a reference voltage and supplies a drive voltage to a drive circuit for driving an external device and which also supplies to an internal device a voltage having a different voltage value from that of the drive voltage obtained by boosting the reference voltage. For example, the semiconductor device may include a drive circuit that drives other device disposed outside, and the included internal device is not limited to the flash memory 22.

What is claimed is:

1. A semiconductor device comprising:
   a drive circuit that outputs a drive signal to drive an external device that is external to the semiconductor device;
   a voltage output circuit that outputs a first voltage and a second voltage that is larger than the first voltage;
   a selector that selects only one of the first voltage and the second voltage, and outputs the selected first voltage or second voltage to a step-up circuit wherein,
   the step-up circuit, when the first voltage selected by the selector is input, boosts the first voltage to a third voltage that is greater than the first voltage and inputs the third voltage as a power supply voltage into the drive circuit and, when the second voltage selected by the selector is inputted, boosts the second voltage to a fourth voltage that is greater than the second voltage and inputs the fourth voltage as the power supply voltage into an internal device that is internal to the semiconductor device.

2. The semiconductor device according to claim 1, wherein the internal device comprises a memory, and, when performing data writing or erasure in the memory, the step-up circuit boosts the second voltage selected by the selector to the fourth voltage and the memory performs data writing or erasure via the fourth voltage outputted by the step-up circuit.

3. The semiconductor device according to claim 1, wherein the voltage output circuit generates and outputs the first voltage and the second voltage by a fifth voltage supplied from outside, and
   the internal device comprises a memory to which the fifth voltage is supplied, and, when performing data reading from the memory, the memory performs data reading via the fifth voltage.

4. The semiconductor device according to claim 1, further comprising
   a first wire that interconnects the drive circuit and the step-up circuit,
   a second wire that interconnects the internal device and the step-up circuit, and
   a substrate on which the drive circuit, the voltage output circuit, the selector, the step-up circuit, the internal device, the first wire, and the second wire are formed, wherein the second wire is formed on the substrate on an inner side of the first wire relative to a periphery of the substrate.

5. The semiconductor device according to claim 4, further comprising a plurality of connection terminals that interconnect the drive circuit and the external device, wherein at least some of the connection terminals are formed on the periphery of the substrate at positions nearer the periphery of the substrate than the drive circuit.

6. The semiconductor device according to claim 1, further comprising an external connection terminal for making connections external to the semiconductor device that is formed adjacent to the step-up circuit and interconnects the step-up circuit and at least one of a step-up capacitor or a stabilizing capacitor disposed outside.

7. The semiconductor device according to claim 1, further comprising a control circuit that controls the selector to select the second voltage when supplying a voltage to the internal device in accordance with an operation of the internal device, wherein at least one of the voltage output circuit or the selector is formed between the control circuit and the step-up circuit.

8. The semiconductor device according to claim 1, wherein the first voltage and the second voltage are boosted by the same step-up circuit.

* * * * *